United States Patent
Briere et al.

(10) Patent No.: US 8,168,000 B2
(45) Date of Patent: May 1, 2012

(54) III-NITRIDE SEMICONDUCTOR DEVICE FABRICATION

(75) Inventors: Mike Briere, Manhattan Beach, CA (US); Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 530 days.

(21) Appl. No.: 11/452,547

(22) Filed: Jun. 14, 2006

(65) Prior Publication Data
US 2007/0000433 A1 Jan. 4, 2007

Related U.S. Application Data

(60) Provisional application No. 60/690,627, filed on Jun. 15, 2005.

(51) Int. Cl.
*C30B 25/04* (2006.01)

(52) U.S. Cl. ........ 117/95; 117/88; 117/89; 117/90; 117/94; 117/97; 117/101; 117/105; 117/106; 257/76; 257/94; 257/201; 257/615

(58) Field of Classification Search ........ 117/45, 117/84–90, 952, 94–95, 97, 101, 105–106, 117/902; 257/94, 76, 201, 615
See application file for complete search history.

(56) References Cited

U.S. PATENT DOCUMENTS

| | | | | |
|---|---|---|---|---|
| 5,122,845 A * | 6/1992 | Manabe et al. | ................ | 257/76 |
| 5,192,987 A | 3/1993 | Khan et al. | | |
| 5,218,216 A * | 6/1993 | Manabe et al. | ................ | 257/103 |
| 5,308,784 A * | 5/1994 | Kim et al. | ................ | 438/427 |
| 5,372,968 A * | 12/1994 | Lur et al. | ................ | 438/425 |
| 5,432,118 A * | 7/1995 | Orlowski et al. | ................ | 438/444 |
| 5,656,832 A * | 8/1997 | Ohba et al. | ................ | 257/190 |
| 5,733,796 A * | 3/1998 | Manabe et al. | ................ | 117/95 |
| 5,795,798 A * | 8/1998 | Mishra et al. | ................ | 438/35 |
| 5,804,839 A * | 9/1998 | Hanaoka et al. | ................ | 257/103 |
| 5,866,466 A * | 2/1999 | Kim et al. | ................ | 438/426 |
| 5,880,485 A | 3/1999 | Marx et al. | | |
| 5,929,466 A * | 7/1999 | Ohba et al. | ................ | 257/103 |
| 5,962,875 A * | 10/1999 | Motoki et al. | ................ | 257/103 |
| 6,015,979 A | 1/2000 | Sugiura et al. | | |
| 6,051,849 A | 4/2000 | Davis et al. | | |
| 6,093,965 A * | 7/2000 | Nakamura et al. | ................ | 257/749 |
| 6,100,104 A * | 8/2000 | Haerle | ................ | 438/33 |
| 6,255,198 B1 * | 7/2001 | Linthicum et al. | ................ | 438/481 |
| 6,261,929 B1 * | 7/2001 | Gehrke et al. | ................ | 438/478 |
| 6,265,289 B1 * | 7/2001 | Zheleva et al. | ................ | 438/503 |
| 6,265,322 B1 * | 7/2001 | Anselm et al. | ................ | 438/745 |
| 6,334,971 B1 * | 1/2002 | Huang | ................ | 264/157 |
| 6,376,339 B2 * | 4/2002 | Linthicum et al. | ................ | 438/479 |
| 6,380,108 B1 * | 4/2002 | Linthicum et al. | ................ | 438/791 |
| 6,508,878 B2 * | 1/2003 | Kim et al. | ................ | 117/89 |
| 6,545,300 B2 * | 4/2003 | Gehrke et al. | ................ | 257/190 |
| 6,570,192 B1 * | 5/2003 | Davis et al. | ................ | 257/103 |

(Continued)

FOREIGN PATENT DOCUMENTS

DE 19838810 A1 3/2000

(Continued)

*Primary Examiner* — Michael Kornakov
*Assistant Examiner* — Kenneth A Bratland, Jr.
(74) *Attorney, Agent, or Firm* — Farjami & Farjami LLP

(57) ABSTRACT

A method of fabricating a III-nitride power semiconductor device which includes selective prevention of the growth of III-nitride semiconductor bodies to selected areas on a substrate in order to reduce stresses and prevent cracking.

37 Claims, 2 Drawing Sheets

U.S. PATENT DOCUMENTS

| | | |
|---|---|---|
| 6,586,778 B2 * | 7/2003 | Linthicum et al. ............ 257/103 |
| 6,607,595 B1 * | 8/2003 | Manabe et al. ................. 117/88 |
| 6,649,287 B2 * | 11/2003 | Weeks et al. ................. 428/698 |
| 6,703,656 B2 * | 3/2004 | Keeth et al. ................... 257/296 |
| 6,864,160 B2 * | 3/2005 | Linthicum et al. ............ 438/479 |
| 6,878,593 B2 | 4/2005 | Khan et al. |
| 6,918,961 B2 * | 7/2005 | Chiyo et al. ................... 117/89 |
| 6,984,536 B2 * | 1/2006 | Manabe et al. ................ 438/22 |
| 7,229,499 B2 * | 6/2007 | Ishida ............................ 117/89 |
| 7,365,369 B2 * | 4/2008 | Nakamura et al. ............ 257/97 |
| 7,378,684 B2 * | 5/2008 | Linthicum et al. ............ 257/76 |
| 7,442,254 B2 * | 10/2008 | Kiyoku et al. ................. 117/95 |
| 7,576,368 B2 * | 8/2009 | Lee et al. ........................ 257/99 |
| 7,588,952 B2 * | 9/2009 | Lee et al. ........................ 438/28 |
| 2002/0074552 A1 * | 6/2002 | Weeks et al. .................... 257/76 |
| 2005/0184343 A1 * | 8/2005 | Thornton et al. ............. 257/351 |
| 2006/0284247 A1 * | 12/2006 | Augustine et al. ............ 257/338 |
| 2007/0018199 A1 * | 1/2007 | Sheppard et al. ............. 257/200 |

FOREIGN PATENT DOCUMENTS

| | | |
|---|---|---|
| JP | 63-281420 | 11/1988 |
| JP | 11-154648 | 6/1999 |
| JP | 2003-257997 | 9/2003 |
| JP | 2003-309071 | 10/2003 |
| JP | 2005-117967 | 5/2005 |
| WO | WO 02/058163 A2 | 7/2002 |

* cited by examiner

Figure 1
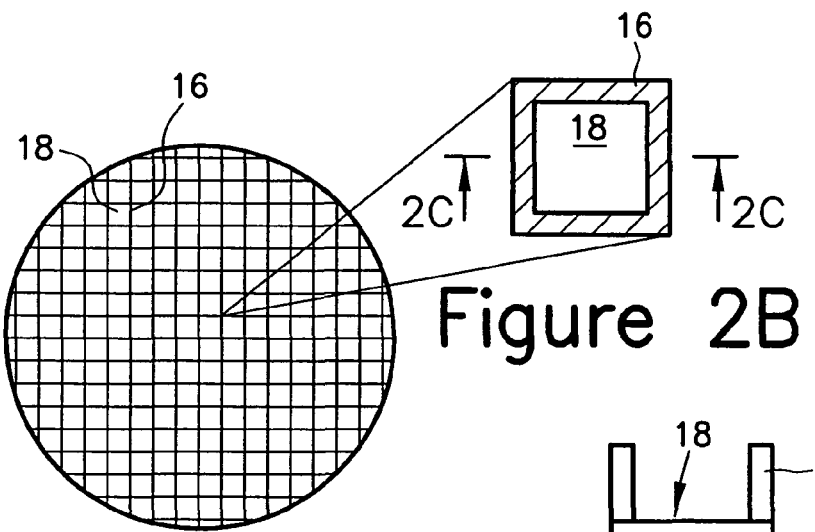
Figure 2B
Figure 2A
Figure 2C
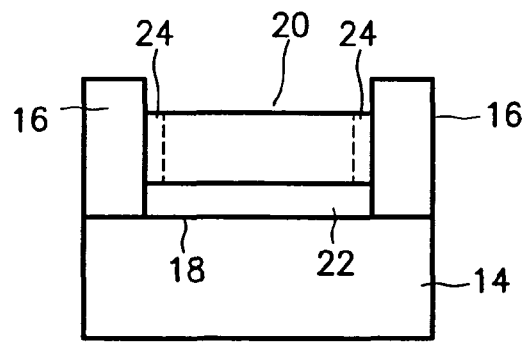
Figure 3

ID-NITRIDE SEMICONDUCTOR DEVICE FABRICATION

RELATED APPLICATION

This application is based on and claims benefit of U.S. Provisional Application Ser. No. 60/690,627, filed Jun. 15, 2005, entitled III-Nitride Semiconductor Device Fabrication, to which a claim of priority is hereby made and the disclosure of which is incorporated by reference.

BACKGROUND OF THE INVENTION

The present invention relates to semiconductor devices and more particularly to III-nitride semiconductor devices and methods of fabricating III-nitride semiconductor devices.

A III-V semiconductor is a semiconductor material that is composed of a group III element and a group V element. III-V semiconductors are desirable for power applications, but have not been exploited extensively due in part to difficulties in fabrication.

For example, one commercially desirable III-V semiconductor is III-nitride. Note that as used herein III-nitride semiconductor or GaN-based semiconductor refers to a semiconductor alloy from the InAlGaN system. Examples of alloys from the InAlGaN system include GaN, AlGaN, AlN, InN, InGaN, and InAlGaN. Note that while nitrogen is present in each alloy, the presence and proportion of In, Al, or Ga can be varied to obtain an alloy in the InAlGaN system.

III-nitride semiconductor devices are desirable for power applications due in large part to the high band gap of III-nitride semiconductor materials. To fabricate a III-nitride semiconductor device at least one III-nitride semiconductor alloy (i.e. an alloy from the InAlGaN system) needs to be formed over a substrate. The three well known substrate materials for III-nitride semiconductor devices are sapphire, SiC and Si.

Silicon substrates are more desirable commercially because of low cost, and high thermal conductivity. However, due to lattice mismatch and differences in the thermal expansion characteristics of III-nitride semiconductor alloys and silicon, thick III-nitride semiconductor layers (e.g. more than 1 micron thick) either crack or cause the silicon wafer to bend. It should be noted that the cracking problem associated with thick III-nitride semiconductor layers is not experienced only when a silicon substrate is used, and thus the problem is not limited to III-nitride semiconductor that is formed on silicon substrates.

SUMMARY OF THE INVENTION

It is an object of the present invention to reduce the stresses due to material incompatibility in the fabrication of a III-nitride semiconductor device in order to prevent cracking or the like mechanical failure. Specifically, it is an object of the present invention to reduce stresses due to material incompatibility when forming a thick (more than one micron) III-nitride semiconductor body on a substrate.

In a process according to the present invention a III-nitride semiconductor growth inhibitor body that is capable of inhibiting the growth of III-nitride semiconductor on the surface thereof is formed in a pattern over a surface of a substrate to define one growth surface or a plurality of growth surfaces on the substrate, and then a III-nitride semiconductor body is grown over the defined growth surface(s). Because the inhibitor body prevents the growth of the III-nitride semiconductor on its surface, the growth of the III-nitride body is limited to the defined growth surface(s). As a result, the dimensions of the growth surface(s) can be selected in order to prevent the cracking of the III-nitride semiconductor due to material incompatibility.

In one embodiment of the present invention, a trench may be formed to extend below the growth surface(s) to define a mesa, and filled with an oxide or the like filler. The trench can further relieve the stress due to material incompatibility.

In yet another embodiment, an amorphous region can be formed below the growth surface(s) in order to further relieve the stress due to material incompatibility.

A process according to the present invention can be configured for wafer level fabrication. Thus, a III-Nitride growth inhibitor body can be formed over a surface of a wafer, and selectively removed to define a plurality of growth surfaces. The III-nitride semiconductor body can then be grown over each growth surface.

Other features and advantages of the present invention will become apparent from the following description of the invention which refers to the accompanying drawings.

BRIEF DESCRIPTION OF THE FIGURES

FIG. 1 schematically shows a side plan view of an intermediate structure obtained in a process according to the present invention.

FIG. 2A schematically shows a top plan view of the structure shown by FIG. 1 viewed in the direction of the arrows.

FIG. 2B schematically shows a top plan view of an individual cell in the structure shown by FIGS. 1 and 2A.

FIG. 2C schematically shows a cross-sectional view of the individual cell shown by FIG. 2B along line 2C-2C and seen in the direction of the arrows.

FIG. 3 schematically shows a cross-sectional view of a single cell in a wafer that is fabricated by a process according to the first embodiment of the present invention.

DETAILED DESCRIPTION OF THE FIGURES

Figure 4:
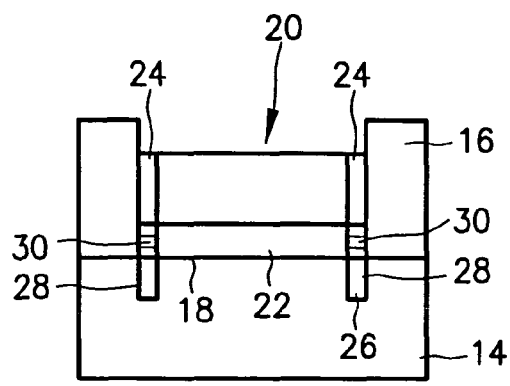
FIG. 4 schematically shows a cross-sectional view of a single cell in a wafer that is fabricated by a process according to the second embodiment of the present invention.

Referring first to FIG. 1, in a process according to the present invention a III-Nitride growth inhibitor body 10 is formed over a surface 12 of a substrate 14. Substrate 14 is a wafer that is composed of any material capable of having a III-nitride semiconductor body formed thereon such as Si, SiC or Sapphire. In the preferred embodiment of the present invention substrate 14 is composed of <111> single crystal of silicon. Furthermore, growth inhibitor body 10 is composed of a material that does not allow crystal growth by a selected III-nitride semiconductor material on a surface thereof. A preferred material for forming growth inhibitive body 10 is silicon dioxide, which can be grown by oxidizing surface 12 of substrate 14 or by depositing an oxide atop surface 12 of substrate 14. Another material that may be suitable for forming growth inhibitor body 10 is $Si_3N_4$.

Referring next to FIG. 2A, growth inhibitor body 10 is patterned by selectively removing portions thereof from surface 12 of substrate 14 by etching or the like to define a plurality of cells arranged in a grid. According to the preferred embodiment of the present invention, the grid resembles the appearance of a waffle.

Referring next to FIG. 2B, which shows a single cell in the grid seen in FIG. 2A, each cell includes III-nitride growth barrier 16 which surrounds a respective growth surface 18 and is preferably rectangular, although other geometric shapes are possible. Also, as seen in FIG. 2C, growth barrier 16 rises above the plane of growth surface 18 to any desired height. The height of growth barrier 16 can be selected to correspond to the desired thickness of the III-nitride device formed over its respective growth surface 18. Preferably, a device formed by a method according to the present invention is one micron or thicker.

In a process according to the present invention a III-nitride semiconductor body 20 can be grown over growth surface 18 within the boundaries set by growth barrier 16. That is, because growth barrier 16 is composed of a material that does not allow the growth of a III-nitride semiconductor material on any surface thereof, the III-nitride semiconductor only grows on growth surface 18. As a result, the dimensions of III-nitride semiconductor body 20 can be restricted by the area defined by growth barrier 16 such that internal stresses due to material incompatibility (lattice mismatch and/or thermal mismatch) can be managed to avoid the cracking of the III-nitride semiconductor. Stated another way, the area of the growth surface 18 may be defined by growth barrier 16 to minimize the stresses due to material incompatibility in order to prevent cracking in the III-nitride semiconductor body 20. The area of the growth surface may be preferably one millimeter square or more.

Referring now to FIG. 3, in a process according to the first embodiment of the present invention, a III-nitride semiconductor body 20 is formed within the space defined by each growth barrier 16 over growth surface 18. Note that III-nitride semiconductor body 20 as referred to herein may include one graded or ungraded III-nitride semiconductor layer, or a plurality of III-nitride semiconductor layers having different compositions. That is, III-nitride semiconductor body 20 as used herein should not be understood to be limited to a single layer of III-nitride semiconductor only.

Specifically, in the preferred embodiment, an interlayer 22 (or sometimes referred to as buffer layer) is first formed on growth surfaces 18, and then a III-nitride semiconductor body 20 is formed over interlayer 22. It should be noted that the material for forming growth barrier 16 is selected such that it does not allow interlayer 22 and III-nitride semiconductor body 20 to grow on any surface thereof. As a result, interlayer 22 only grows on growth surfaces 18 and then III-nitride semiconductor body 20 grows only on interlayer 22. It should be noted that after formation III-nitride semiconductor body may include a region of high dislocations 24 at the outer periphery thereof adjacent growth barrier 16.

Preferably, interlayer 22 is a compositionally graded III-nitride semiconductor material from the InAlGaN system such as AlN, AlGaInN or AlGaN. Compositionally graded as referred to herein means that the aluminum content changes along the thickness of interlayer 22 preferably from an aluminum rich composition, e.g. AlN, adjacent growth surface 18 to a composition that is essentially free from aluminum, e.g. GaN. Alternatively, interlayer 22 may include multiple layers of III-nitride semiconductor bodies from the InAlGaN system, each being of a different composition.

III-nitride semiconductor body 20 is preferably comprised of GaN, which is more than 1 μm thick and is suitable for power related applications. That is, III-nitride semiconductor body 20 is composed of GaN thick enough and configured to serve as a constituent body in a power semiconductor device such as a high electron mobility transistor (HEMT), metal insulator semiconductor HEMT (MISHEMT), or the like device.

Referring next to FIG. 4, in which like numerals identify like features, in a process according to the second embodiment of the present invention a trench 26 is formed to extend from growth surface 18 to a predetermined depth into the body of substrate 14. Trench 26 preferably defines a mesa having growth surface 18 at the top thereof, and is preferably filled with silicon dioxide 28 or the like. In a process according to the second embodiment, after trench 26 is filled, interlayer 22 is formed on growth surface 18. It should be noted that interlayer 22 laterally extends over silicon dioxide 28 in trench 26, and may also extend to growth barrier 16. Interlayer 22 may include a region of high dislocation density 30 at the outer periphery thereof adjacent growth barrier 16. The remaining steps in a process according to the second embodiment are identical to those of the first embodiment, and thus are not repeated. Trench 26 allows for further relief of stresses due to material incompatibility, which may in turn prevent the cracking of the III-nitride semiconductor body 20.

Figure 5:
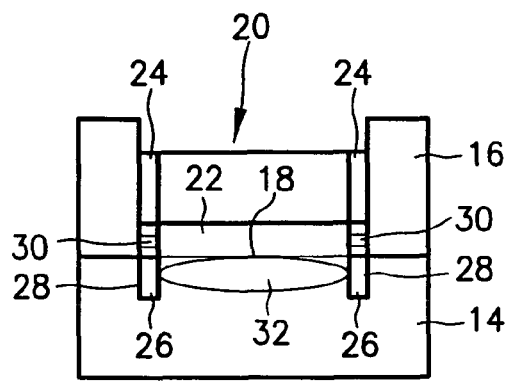
FIG. 5 schematically shows a cross-sectional view of a single cell in a wafer that is fabricated by a process according to the third embodiment of the present invention.

Referring next to FIG. 5, in a process according to the third embodiment of the present invention the crystal structure of the mesa is damaged by ion implantation or the like in order to form amorphous region 32 therein. Amorphous region 32 can further reduce the stress caused by material incompatibility and thereby prevent cracking of the III-nitride semiconductor body 20. It should be noted that in an alternative process trench 28 can be eliminated and the crystal structure below growth surface 18 can be rendered amorphous in order to obtain the desired stress relief. The remaining steps in a process according to the third embodiment are identical to those in the second or the first embodiment (if trench 28 is omitted), and thus will not be repeated herein for the sake of brevity.

After forming III-nitride semiconductor body 20, further processing can be carried out as desired to form semiconductor devices such as HEMTs in each cell on substrate 14. Thus, for example, a layer of AlGaN can be grown over a GaN (when GaN is used to form III-nitride semiconductor body 20) to form a heterojunction in a process for fabricating a HEMT.

Figure 6:
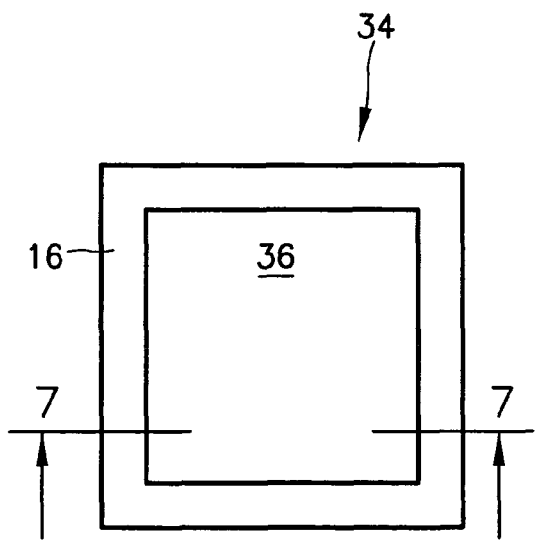
FIG. 6 schematically shows a top plan view of a semiconductor device die fabricated through a process according to the present invention.
Figure 7:
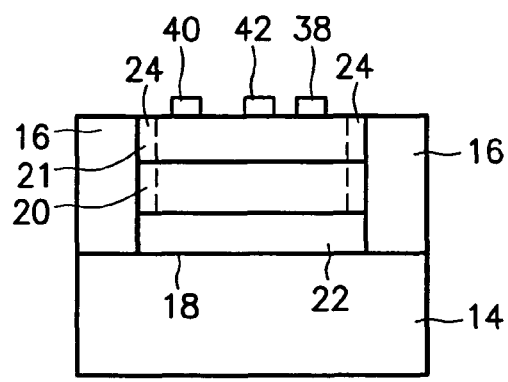
FIG. 7 schematically illustrates a cross-sectional view of the die illustrated in FIG. 6 along line 7-7 and viewed in the direction of the arrows.

Thereafter, individual semiconductor device die can be obtained by dicing. Preferably, wafer 15 can be diced by cutting through growth barriers 16 to obtain individual singulated die 34, which may have barrier 16 at the outer periphery thereof and a semiconductor device 36 within barrier 16 as seen in FIG. 6. Referring, for example, to FIG. 7, a device 36 may include III-nitride semiconductor body 20, which may be composed of GaN, and another III-nitride semiconductor body 21 composed of another semiconductor alloy from the InAlGaN system such as AlGaN formed over semiconductor body 20 to obtain a III-nitride active heterojunction. Power electrodes, e.g. drain electrode 38, and source electrode 40, control electrode 42 of device 36 are schematically shown as well. Examples of III-nitride based devices that can be fabricated on growth surface 18 can be found in U.S. Pat. Nos. 5,192,987, and 6,878,593.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a III-nitride semiconductor device, comprising:
forming a III-nitride growth inhibitor body over a surface of a substrate;
selectively removing portions of said III-nitride growth inhibitor body to expose portions of said substrate to serve as a III-nitride growth surface;
forming a trench around at least one of said exposed portions, said trench extending below said III-nitride growth surface;
filling said trench, a top surface of said filled trench generally coplanar with and laterally extending said III-nitride growth surface; and
growing a III-nitride semiconductor body over at least one of said exposed portions, said III-nitride semiconductor body being surrounded by said III-nitride growth inhibitor body;
wherein said III-nitride growth inhibitor body defines the outer boundary of said III-nitride semiconductor device.

2. The method of claim 1, wherein said III-nitride semiconductor body includes a buffer layer on said at least one of said exposed portions and a III-nitride semiconductor power device formed over said buffer layer.

3. The method of claim 2, wherein said buffer layer is comprised of AlN.

4. The method of claim 2, wherein said buffer layer is graded.

5. The method of claim 2, wherein said buffer layer is comprised of graded AlN.

6. The method of claim 2, wherein said III-nitride power semiconductor device includes a GaN body and an AlGaN body over said GaN body.

7. The method of claim 1, wherein said III-nitride growth inhibitor body is comprised of silicon dioxide.

8. The method of claim 1, wherein said III-nitride growth inhibitor body is comprised of silicon nitride.

9. The method of claim 1, wherein said III-nitride growth inhibitor body is waffled.

10. The method of claim 1, wherein said trench extends into the body of said substrate.

11. The method of claim 1, further comprising filling said trench with a III-nitride growth inhibitor body.

12. The method of claim 1, further comprising damaging the crystal structure of a region below at least one of said exposed portions to form an amorphous region.

13. The method of claim 1, wherein said substrate is comprised of silicon.

14. The method of claim 1, wherein said substrate is comprised of silicon carbide.

15. The method of claim 1, wherein said substrate is comprised of sapphire.

16. The method of claim 1, wherein a III-nitride semiconductor body includes a first III-nitride semiconductor body comprised of one alloy from the InAlGaN system, and another alloy from the InAlGaN system.

17. The method of claim 1, wherein said III-nitride growth inhibitor body is selectively removed to form a grid pattern on said substrate.

18. The method of claim 1, wherein said growth surface is at least one millimeter square.

19. The method of claim 1, wherein said III-nitride growth inhibitor body defines the height of said III-nitride device.

20. The method of claim 19, wherein said height is at least one micron.

21. A method of fabricating a III-nitride based semiconductor device, comprising:
forming III-nitride growth barriers over a surface of a substrate, each of said III-nitride growth barriers surrounding a corresponding III-nitride semiconductor growth surface;
forming a trench around at least one of said III-nitride semiconductor growth surfaces, said trench extending below said III-nitride growth surface;
filling said trench, a top surface of said filled trench generally coplanar with and laterally extending said III-nitride semiconductor growth surface; and
growing a III-nitride semiconductor body over at least one of said defined III-nitride semiconductor growth surfaces;
wherein each of said III-nitride growth barriers defines the outer boundary of a respective semiconductor device.

22. A method according to claim 21, wherein said barriers are comprised of silicon dioxide.

23. A method according to claim 21, wherein said barriers are comprised of silicon nitride.

24. A method according to claim 21, wherein said substrate is comprised of silicon.

25. A method according to claim 21, wherein said substrate is comprised of silicon carbide.

26. A method according to claim 21, wherein said substrate is comprised of sapphire.

27. A method according to claim 21, further comprising growing an interlayer on at least one of said growth surfaces and then growing a III-nitride semiconductor body over said interlayer.

28. A method according to claim 27, wherein said interlayer is comprised of AlN.

29. A method according to claim 27, wherein said interlayer is comprised of graded AlN.

30. A method according to claim 21, wherein said III-nitride semiconductor body is a heterojunction that includes one III-nitride semiconductor body comprised of one semiconductor alloy from the InAlGaN system and another III-nitride semiconductor body comprised of another semiconductor alloy from the InAlGaN system.

31. A method according to claim 21, wherein at least one of said growth surfaces is at least one millimeter square.

32. A method according to claim 21, wherein said growth barriers define the height of said III-nitride based semiconductor devices.

33. A method according to claim 32, wherein the height is at least one micron.

34. A method according to claim 2, wherein said buffer layer is a graded III-nitride material from the InAlGaN system.

35. A method according to claim 27, wherein said interlayer is a graded III-nitride material from the InAlGaN system.

36. A method according to claim 2, wherein said buffer layer is comprised of multiple layers of III-nitride semiconductor from the InAlGaN system, each layer being of a different composition.

37. A method according to claim 27, wherein said interlayer is comprised of multiple layers of III-nitride semiconductor from the InAlGaN system each layer being of a different composition.

* * * * *